United States Patent
Kulla et al.

(10) Patent No.: US 10,845,214 B2
(45) Date of Patent: Nov. 24, 2020

(54) MAGNETIC FIELD SENSOR WITH THRESHOLD LEVEL LIMITS AND ASSOCIATED METHODS

(71) Applicant: Allegro MicroSystems, LLC, Manchester, NH (US)

(72) Inventors: Florian Kulla, Annecy (FR); Cédric Gillet, Annecy (FR)

(73) Assignee: Allego MicroSystems, LLC, Manchester, NH (US)

(*) Notice: Subject to any disclaimer, the term of this patent is extended or adjusted under 35 U.S.C. 154(b) by 67 days.

(21) Appl. No.: 16/397,162

(22) Filed: Apr. 29, 2019

(65) Prior Publication Data

US 2020/0340833 A1    Oct. 29, 2020

(51) Int. Cl.
    *G01R 33/09*    (2006.01)
    *G01D 5/16*    (2006.01)
    *G01R 33/00*    (2006.01)

(52) U.S. Cl.
    CPC ........... *G01D 5/16* (2013.01); *G01R 33/0023* (2013.01); *G01R 33/093* (2013.01); *G01R 33/098* (2013.01)

(58) Field of Classification Search
    CPC ............ G01R 33/09; G11B 2005/0016; G11B 2005/3996; Y10T 428/1107
    See application file for complete search history.

(56) References Cited

U.S. PATENT DOCUMENTS

| | | | |
|---|---|---|---|
| 6,091,239 A | 7/2000 | Vig et al. | |
| 6,525,531 B2 | 2/2003 | Forrest et al. | |
| 2019/0383885 A1* | 12/2019 | Sitorus | G01R 33/09 |
| 2019/0383886 A1* | 12/2019 | Shoemaker | G01R 33/072 |

* cited by examiner

*Primary Examiner* — Tung X Nguyen
(74) *Attorney, Agent, or Firm* — Daly, Crowley, Mofford & Durkee, LLP (57) ABSTRACT

A magnetic field sensor including at least one magnetoresistance element configured to generate a magnetic field signal indicative of a magnetic field associated with a target having features and spaced from the at least one magnetoresistance element by an airgap. The sensor includes a detector responsive to the magnetic field signal and to a threshold level to generate a sensor output signal containing transitions, each transition associated with a feature of the target and occurring in response to the magnetic field signal crossing the threshold level. The sensor includes a threshold generator configured to generate the threshold level having a rising threshold level limit and a falling threshold level limit.

16 Claims, 6 Drawing Sheets

MAGNETIC FIELD SENSOR WITH THRESHOLD LEVEL LIMITS AND ASSOCIATED METHODS

CROSS-REFERENCE TO RELATED APPLICATIONS

Not Applicable.

STATEMENT REGARDING FEDERALLY SPONSORED RESEARCH

Not Applicable.

FIELD

This invention relates generally to magnetic field sensors and, more particularly, to magnetic field sensors implementing threshold level limits.

BACKGROUND

As is known, magnetic field sensors are used in a variety of applications. One example application is in motion (e.g., rotation) detectors where a magnetic field sensor is used to detect motion of an object, such as a ferromagnetic object, for example, a gear or ring magnet. In motion detectors, the magnetic field is typically detected by one or more magnetic field sensing elements, such as Hall effect elements or magnetoresistance elements, which provide a signal (i.e., a magnetic field signal) proportional to a detected magnetic field.

Some motion detectors generate an output signal indicative of the speed of motion of the object. Other motion detectors generate an output signal indicative of a direction of motion of the object as well. One such motion detector is described in U.S. Pat. No. 8,624,588 entitled "Apparatus and Method for Providing an Output Signal Indicative of a Speed of Rotation and a Direction of Rotation as a Ferromagnetic Object," which is assigned to the assignee of the present disclosure and incorporated herein by reference in its entirety.

Motion detectors are widely used in automobile control systems, for example to detect motion of a target object (e.g., camshaft) and to provide information (e.g., an absolute angle of rotation of the target object) to an engine control processor for ignition timing control, fuel management and other operations. With this information, the engine control processor can adjust the timing of firing of the ignition system, the timing of fuel injection by the fuel injection system and perform other operations.

In high precision applications such as automobiles, accuracy variations in the detected motion of a target object (e.g., resulting from irregularities in a sensed target profile of the target object) can be problematic. Engine ignition timing, for example, depends on consistent detection accuracy. Some magnetic field sensor integrated circuits (ICs) contain circuitry and methods to mitigate the effects of irregularities resulting from mechanical variations such as rotational wobble or changes in an airgap between the IC and the target object.

SUMMARY

According to the disclosure, a magnetic field sensor includes at least one magnetoresistance element configured to generate a magnetic field signal indicative of a magnetic field associated with a target having features and spaced from the at least one magnetoresistance element by an airgap, a detector responsive to the magnetic field signal and to a threshold level to generate a sensor output signal containing transitions, each transition associated with a feature of the target and occurring in response to the magnetic field signal crossing the threshold level, and a threshold generator configured to generate the threshold level having a rising threshold level limit and a falling threshold level limit.

With this arrangement, error between transitions of the sensor output signal and mechanical features of the target can be accurately controlled and minimized over airgap variations. This advantage is achieved by generating threshold levels that have a rising threshold level limit and a falling threshold level limit.

Features may include one or more of the following individually or in combination with other features. The magnetic field sensor can further include an analog-to-digital converter configured to convert the magnetic field signal into a digitized magnetic field signal, wherein the analog-to-digital converter generates the digitized magnetic field signal represented by a predetermined number of codes, with each code corresponding to a value of the magnetic field signal. The code can be selected based on an expected maximum value of the airgap and an expected undershoot of the magnetic field signal. The detector can be configured to track a positive peak of the magnetic field signal to generate a positive peak value, track a negative peak of the magnetic field signal to generate a negative peak value, and track a baseline of the magnetic field signal corresponding to an infinite airgap between the at least one magnetoresistance element and the target. The threshold level can be a threshold level used by the detector to generate the sensor output signal during a start-up mode of operation of the sensor and wherein the threshold generator can be further configured to generate a running mode threshold level having a value that is a predetermined percentage of a difference between the positive peak value and the negative peak value. The falling threshold level limit can include the maximum of (a) the positive peak value minus a predetermined percentage of a difference between the positive peak value and a baseline value, (b) the baseline value plus the predetermined number of codes, or (c) the positive peak value minus the predetermined number of codes. The rising threshold level limit can include the maximum of (a) the negative peak value plus a predetermined percentage of a difference between the positive peak value and a baseline value, (b) the baseline value plus the predetermined number of codes, or (c) the negative peak value plus the predetermined number of codes. The at least one magnetoresistance element can include one or more GMR, and/or TMR, and/or AMR, and/or more generally any magnetoresistance element). The magnetic field sensor can be a camshaft speed sensor.

Also described is a method including generating a magnetic field signal with at least one magnetoresistance element, the magnetic field signal indicative of a magnetic field associated with a target having features and spaced from the at least one magnetoresistance element by an airgap, generating a threshold level having a rising threshold level limit and a falling threshold level limit, and generating a sensor output signal having transitions, each transition associated with a feature of the target and occurring in response to the magnetic field signal crossing the threshold level.

Features may include one or more of the following individually or in combination with other features. The method may further include converting the magnetic field signal into a digitized magnetic field signal by an analog-to-digital converter, wherein the analog-to-digital converter can generate the digitized magnetic field signal represented by a predetermined number of codes, with each code corresponding to a value of the magnetic field signal. A detector can be responsive to the threshold level and to the magnetic field signal, and the method can further include, by the detector, tracking a positive peak of the magnetic field signal to generate a positive peak value, tracking a negative peak of the magnetic field signal to generate a negative peak value, and tracking a baseline of the magnetic field signal corresponding to an infinite airgap between the at least one magnetoresistance element and the target. The threshold level can be a start-up threshold level used by the detector to generate the sensor output signal during a start-up mode of operation and wherein the method further includes generating a running mode threshold level having a value that is a predetermined percentage of a difference between the positive peak value and the negative peak value. The falling threshold level limit can be the maximum of (a) the positive peak value minus a predetermined percentage of a difference between the positive peak value and a baseline value; (b) the baseline value plus the predetermined number of codes; or (c) the positive peak value minus the predetermined number of codes. The rising threshold level limit can be the maximum of (a) the negative peak value plus a predetermined percentage of a difference between the positive peak value and a baseline value; (b) the baseline value plus the predetermined number of codes; or (c) the negative peak value plus the predetermined number of codes.

According to a further aspect, a magnetic field sensor includes means for generating a magnetic field signal with at least one magnetoresistance element, the magnetic field signal indicative of a magnetic field associated with a target having features and spaced from the at least one magnetoresistance element by an airgap, means for generating a threshold level having a rising threshold level limit and a falling threshold level limit, and means for generating a sensor output signal having transitions, each transition associated with a feature of the target and occurring in response to the magnetic field signal crossing the threshold level.

Features may include one or more of the following individually or in combination with other features. The magnetic field sensor can further include means for converting the magnetic field signal into a digitized magnetic field signal represented by a predetermined number of codes, each code corresponding to a value of the magnetic field signal. The magnetic field sensor can further include means for tracking a positive peak of the magnetic field signal to generate a positive peak value, tracking a negative peak of the magnetic field signal to generate a negative peak value, and tracking a baseline of the magnetic field signal corresponding to an infinite airgap between the at least one magnetoresistance element and the target. The threshold level can be a start-up threshold level used to generate the sensor output signal during a start-up mode of operation of the sensor and wherein the magnetic field sensor further includes means for generating a running mode threshold level having a value that is a predetermined percentage of a difference between the positive peak value and the negative peak value.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Before describing the present invention, some introductory concepts and terminology are explained. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate or in the plane of the substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of maximum sensitivity perpendicular to a substrate, while metal based or metallic magnetoresistance elements (e.g., GMR, TMR, AMR) and vertical Hall elements tend to have axes of maximum sensitivity parallel to a substrate.

As used herein, the term "magnetic field signal" is used to describe any signal that results from a magnetic field experienced by a magnetic field sensing element.

As used herein, the term "magnetic field sensor" or simply "sensor" is used to describe a circuit that uses one or more magnetic field sensing elements, generally in combination with other circuits. The magnetic field sensor can be, for example, a rotation detector, a movement detector, a current sensor, or a proximity detector. A rotation detector can sense rotation of an object, for example, advance and retreat of magnetic domains of a ring magnet or advance and retreat of gear teeth of a ferromagnetic gear. The term "movement detector" can be used to describe either a rotation detector or a magnetic field sensor that can sense different movement, e.g., linear movement, of a ferromagnetic object, for example, linear movement of magnetic domains of a ring magnet or linear movement of gear teeth of a ferromagnetic gear.

Magnetic field sensors are used in a variety of applications, including, but not limited to an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field. The circuits and techniques described herein apply to any magnetic field sensor capable of detecting a magnetic field.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

It should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Figure 1:
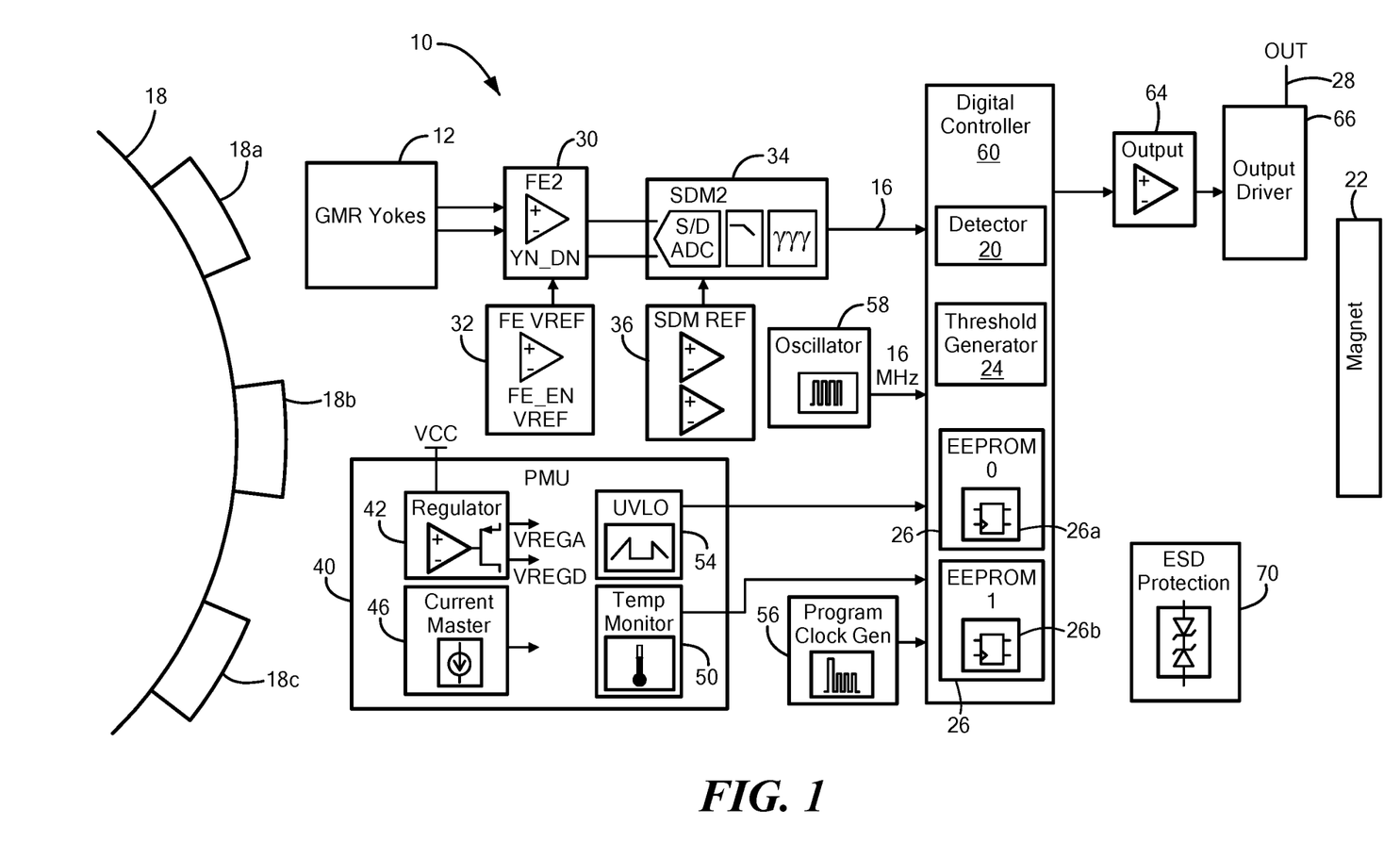
FIG. 1 is a block diagram of a magnetic field sensor including a threshold generator according to the disclosure.

Referring to FIG. 1, a magnetic field sensor 10 includes at least one magnetic field sensing element 12 configured to generate a magnetic field signal 16 indicative of a magnetic field associated with a target 18 and a detector 20 responsive to the magnetic field signal and to a threshold level from a threshold generator 24 to generate a sensor output signal 28 containing transitions associated with features of the target in response to the magnetic field signal crossing the threshold level. As will be explained, the threshold generator 24 is configured to generate a threshold level in order to achieve accurate target position information and that accommodates variations in airgap.

Target 18 can have a variety of forms, including, but not limited to a gear having gear teeth 18a-18c or a ring magnet having one or more pole pair. Also, linear arrangements of ferromagnetic objects that move linearly are possible. In the example embedment of FIG. 1, magnetic field sensor 10 may take the form of a rotation detector to detect passing gear teeth, for example, gear teeth 18a-18c of a ferromagnetic gear or, more generally target object 18. A permanent magnet 22 can be placed at a variety of positions proximate to the gear 18, resulting in fluctuations of a magnetic field proximate to the gear as the gear rotates in a so-called "back-bias" arrangement for example.

Features of the target 18 are spaced from the sensing element(s) 12 by an airgap. Although intended to be fixed once the sensor 10 is in place in a particular application, airgap can vary for a variety of reasons.

Sensing element(s) 12 can take a variety of forms, such as the illustrated GMR yokes as may be arranged in one or more bridge or other configurations in order to generate one or more single-ended or differential signals indicative of the sensed magnetic field. Although shown and described with a GMR as the magnetic field sensing element, it will be appreciated that the sensing element could be any magnetoresistance element, such as TMR, or any magnetic field sensing element that produces a signal shape having an undershoot on the valleys of the signal during start-up of the magnetic field sensor.

A front-end amplifier 30 can be used to process the magnetic field sensing element output signal to generate a further signal for coupling to an analog-to-digital converter (ADC) 34 as may include one or more filters, such as a low pass filter and/or notch filter, and as may take the form of a sigma delta modulator to generate a digital magnetic field signal 16. Features of the magnetic field signal processing can include a front-end reference 32 and a sigma delta reference 36.

The ADC 34 is configured to convert the analog magnetic field signal into a digitized magnetic field signal 16 represented by a predetermined number of codes, with each code corresponding to a value (or to a range of values) of the magnetic field signal. The number of codes of the ADC can be selected to achieve a desired resolution needed by the system. The greater number of codes of an ADC will result in better resolution and better system performance.

Sensor 10 includes a power management unit (PMU) 40 as may contain various circuitry to perform power management functions. For example, a regulator 42 can output a regulated voltage for powering analog circuitry of the sensor (VREGA) and/or a regulated voltage for powering digital circuitry of the sensor (VREGD). A bias current source 46, a temperature monitor 50 and an undervoltage lockout 54 can monitor current, temperature, and voltage levels and provide associated status signals to a digital controller 60. A clock generation element 56 and an oscillator 58 are coupled to the digital controller 60.

Digital controller 60 processes the magnetic field signal 16 to determine the speed, position, and/or direction of movement, such as rotation of target 18 and outputs one or more digital signals to an output protocol module 64. More particularly, controller 60 determines the speed, position, and/or direction of target 18 based on the magnetic field signal 16 and can combine this information with fault information in some embodiments to generate the sensor output signal 28 in various formats. The output of module 64 is fed to an output driver 66 that provides the sensor output signal 28 in various formats, such as a so-called two-wire format in which the output signal is provided in the form of current pulses on the power connection to the sensor or a three-wire format in which the output signal is provided at a separate dedicated output connection. Formats of the output signal 28 can include variety of formats, for example a pulse-width modulated (PWM) signal format, a Single Edge Nibble Transmission (SENT) format, a Serial Peripheral Interface (SPI) format, a Local Interconnect Network (LIN) format, a CAN (Controller Area Network) format, an Inter-Integrated Circuit (I²C) format, or other similar signal formats. Sensor 10 can further include electrostatic discharge (ESD) protection 70.

The digital controller 60 includes detector 20, threshold generator 24, and memory 26 such as EEPROMs 26a, 26b. As described further below, the threshold generator 24 is configured to generate a threshold level having a rising threshold level limit and a falling threshold level limit. The rising and falling threshold level limits may be derived from the magnetic field signal generated by the magnetic field sensing element(s) 12.

Detector 20 is coupled to receive the threshold level thus generated and the magnetic field signal 16 and compare the received levels to generate a binary, two-state, detector output signal that has transitions when the signal 16 crosses the threshold level. Movement speed of the target 18 can be detected in accordance with the frequency of the binary signal.

More particularly, the detector 20 is configured to track a positive peak of the magnetic field signal 16 to generate a positive peak value ("ppeak"), track a negative peak of the magnetic field signal to generate a negative peak value ("npeak"), and track a baseline of the magnetic field signal. The ppeak value can correspond to a highest (most positive) value of the encountered magnetic field signal and the npeak value can correspond to a lowest (most negative) value of the encountered magnetic field signal. The baseline of the magnetic field signal can correspond to a value of the magnetic field signal when there is an infinite airgap between the magnetoresistance element(s) 12 and the target. The baseline can be measured during production of the sensor.

It should be appreciated that a direction of rotation of the target 18 may be determined in embodiments containing multiple sensing element(s) 12 configured to generate phase separated magnetic field signals (as are sometimes referred to as channel signals), in which case the direction of rotation can be determined based on a relative phase or relative time difference (e.g., lag or lead) of a particular edge transition of detector output signals associated with the phase separated magnetic field signals.

Figure 2:
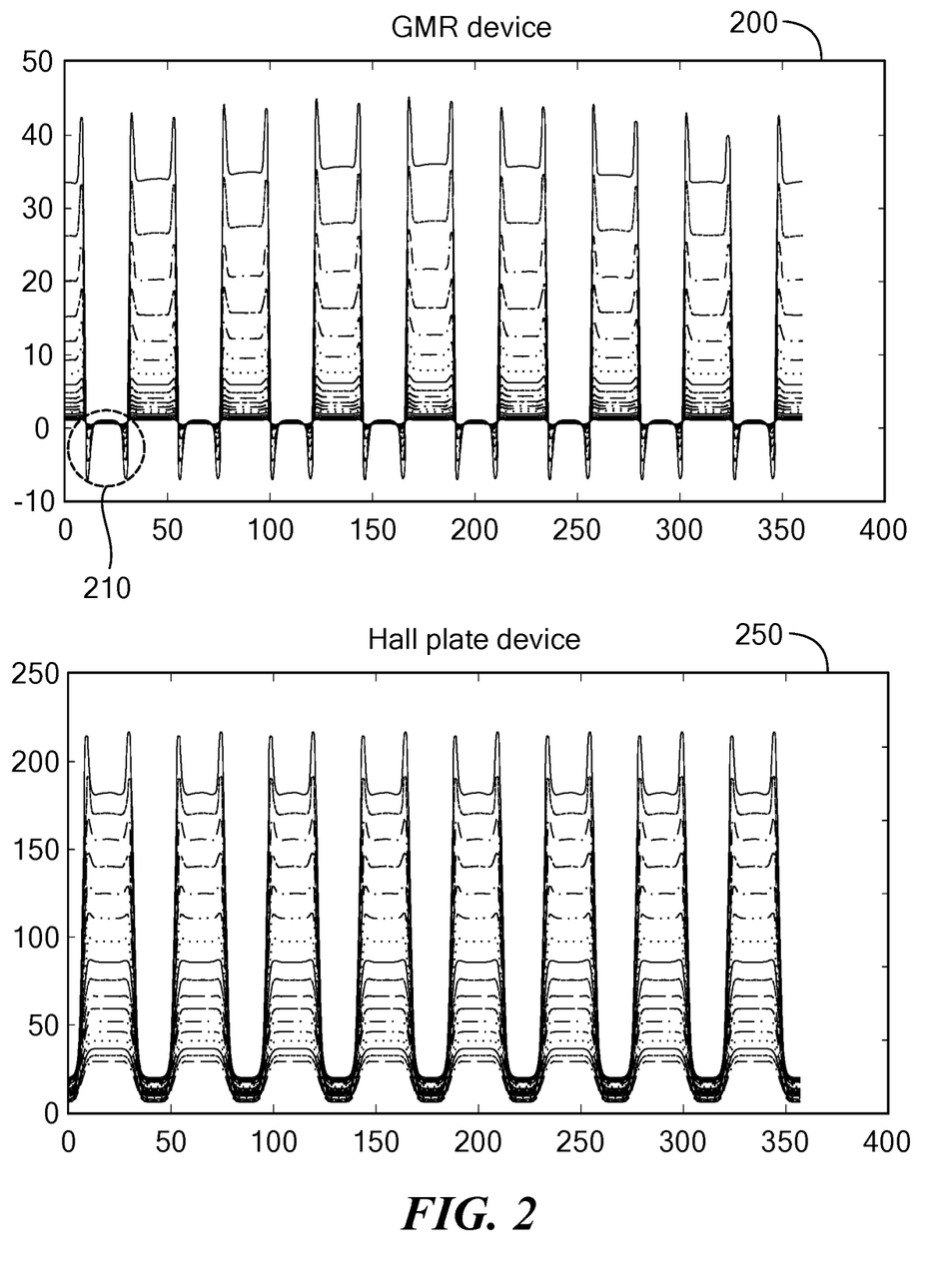
FIG. 2 shows example magnetic field signals for both Hall plate and GMR magnetic field sensing elements.

FIG. 2 shows an example magnetic field signal in graph 200 during operation of the sensor 10 of FIG. 1 including GMR magnetic field sensing element(s) 12. Also shown in FIG. 2 is a graph 250 illustrating an example magnetic field signal for a sensor including one or more Hall plate sensing elements (sensor with Hall plate element(s) not shown). As shown in graph 200, during operation of the sensor 10, there can be undershoot 210 at the valleys of the signal. Such undershoot generally does not occur when using, for example, a Hall plate as the sensing element, as shown in graph 250. Note that the undershoot can particularly be a problem during start-up of a sensor, for example, if the sensor starts at the overshoot (bat-ear shaped overshoot) then the undershoot can incorrectly be interpreted as a gear tooth or other identifying feature of the target.

The "start-up" mode of operation of the magnetic field sensor 10 refers to when only a minimal amount of object rotation has occurred (e.g., less than a predetermined number of object features (e.g., gear teeth) have passed the sensor or less than a predetermined number of degrees of rotation have occurred), after the sensor has been powered on, and during which the detector 20 acquires the positive and negative peaks of the magnetic field signal 16. In some embodiments, the start-up mode can end after a certain amount of target movement (e.g., a certain number of rotations of the target 18 or a certain number of features detected), when the tracked positive and negative magnetic field signal peaks are considered to be accurate, following which a running mode of operation is entered. The start-up mode can end after a single feature of the object (e.g., a gear tooth) has been detected. Note that if the sensor commences detection during start-up, an undershoot can be incorrectly interpreted as a feature (e.g., tooth gear) of the object if a conventional hysteresis level were used.

The threshold level generated by the threshold generator 24 can include a start-up threshold level used by the detector 20 to generate the sensor output signal 28 during the start-up mode of operation of the sensor and can further include a running mode threshold level for use during a running mode of operation following the start-up mode.

In embodiments, the running mode threshold level provided by the threshold generator 24 during the running mode of sensor operation can have a value that is predetermined percentage (which can be approximately half way or 56.5%) of a difference between the positive peak value and the negative peak value.

Figure 3:
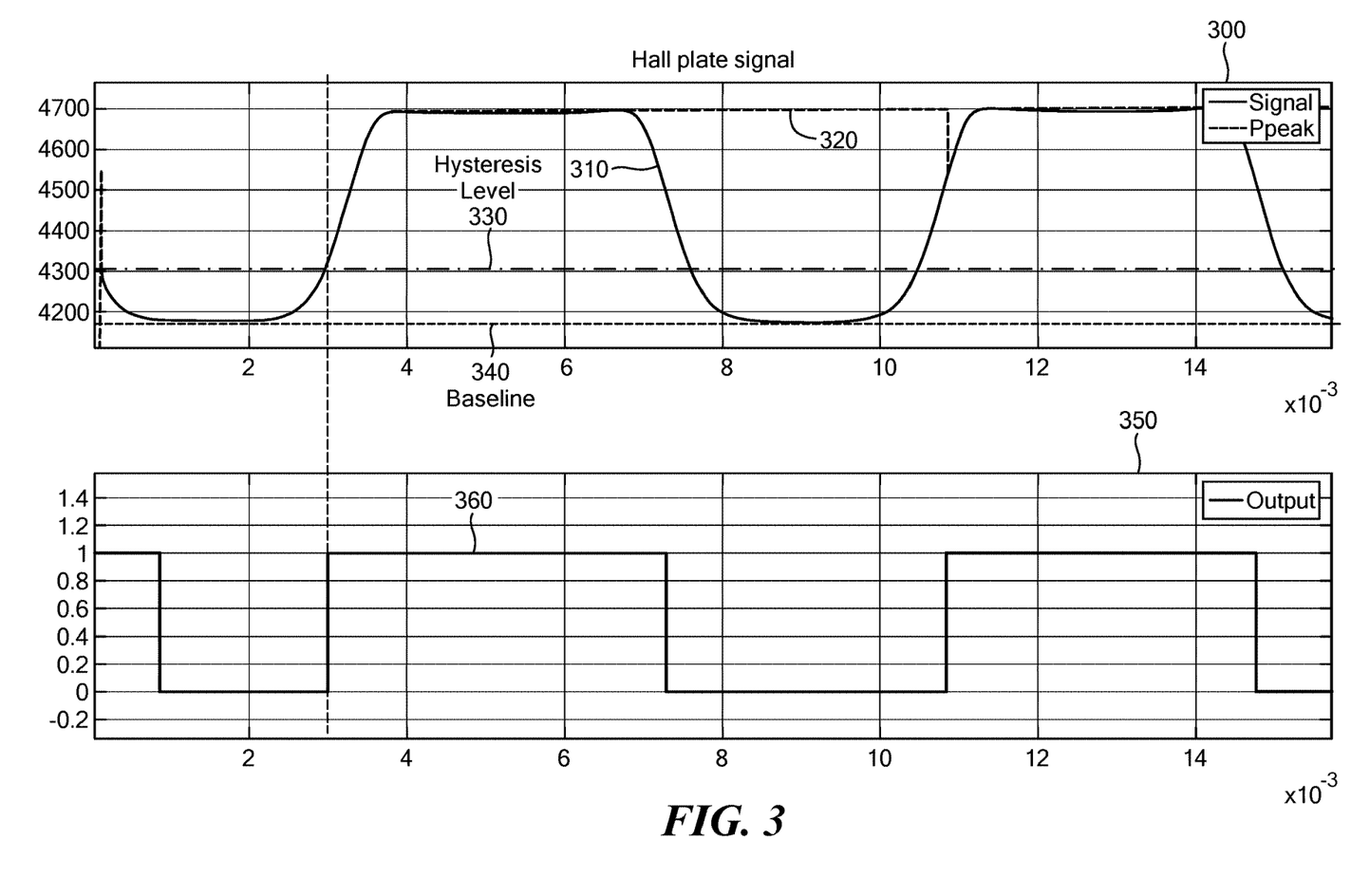
FIG. 3 shows example magnetic field signals and an example corresponding output signal for a magnetic field sensor having a Hall plate as the magnetic field sensing element and implementing a hysteresis threshold level.

A conventional start-up method can be used for a sensor with a Hall plate magnetic field sensing element with minimal detection error because Hall plates generally do not experience undershoot during operation of the sensor. Refer to FIG. 3 showing an example magnetic field signal 310 generated by a Hall plate and an example corresponding sensor output signal 360 for a magnetic field sensor containing the Hall plate as its magnetic field sensing element (not shown) and implementing a conventional threshold level 330. FIG. 3 shows graph 300 with a magnetic field signal 310, a ppeak signal 320 representing a positive peak value of the magnetic field signal, a threshold level 330, and a baseline level 340 representing an expected sensed signal at an infinite airgap condition. The conventional threshold level 330 can be a percentage of the difference between the ppeak level 320 and the baseline 340 for example. Threshold level 330 is labeled "hysteresis level" since once the signal becomes larger than the hysteresis level (or the difference between the ppeak and npeak passes the hysteresis level), the sensor leaves the start-up mode and enters normal operation.

The graph 350 shows the corresponding sensor output signal 360 for the conventional Hall-based sensor. As is shown, transitions of the sensor output signal 360 coincide generally with target features (which features generally align with the waveshape of the magnetic field signal 310).

Figure 4:
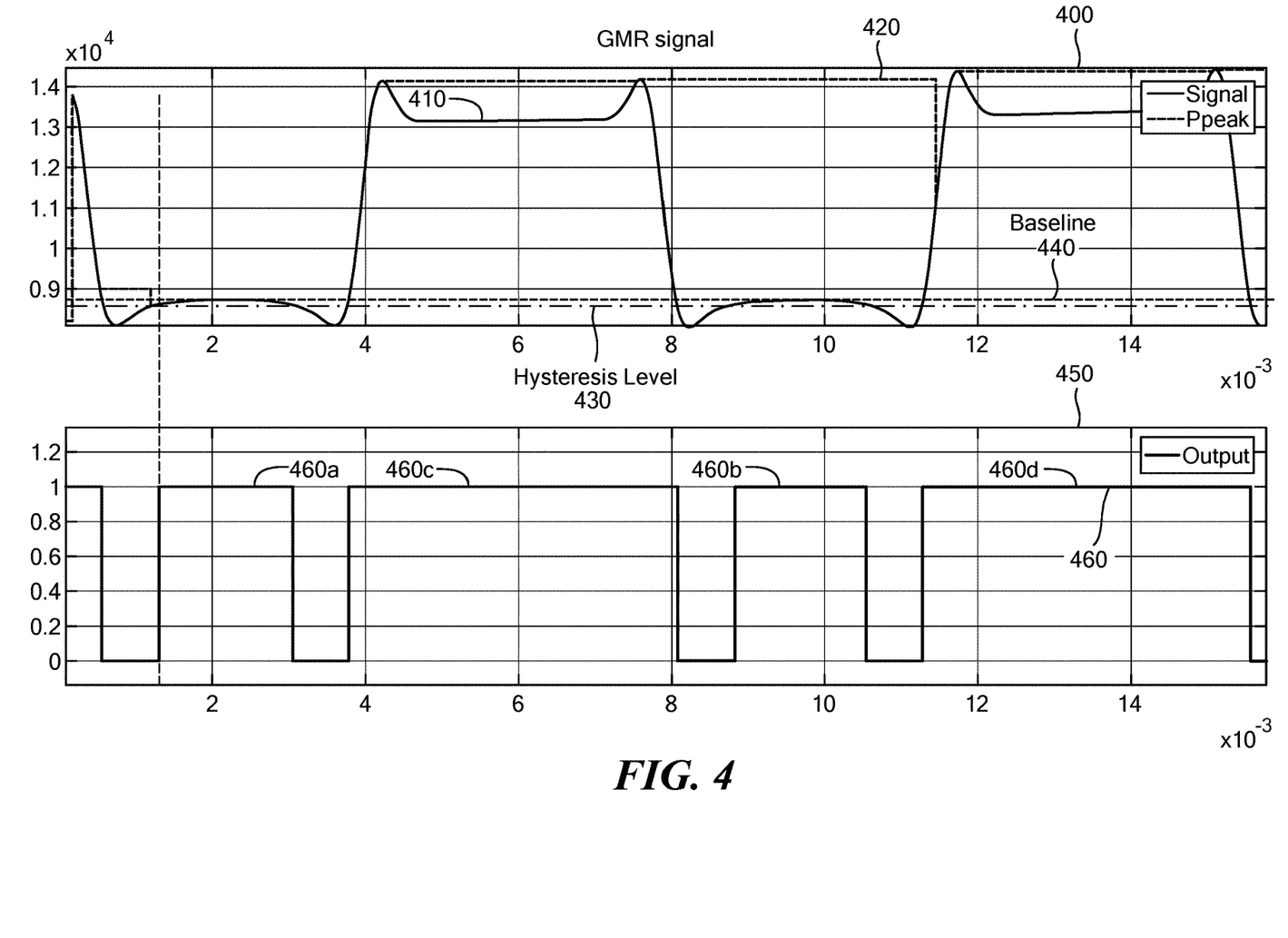
FIG. 4 shows example magnetic field signals and an example corresponding output signal for a magnetic field sensor having a GMR as the magnetic field sensing element and implementing a hysteresis threshold level.

FIG. 4 is a graph showing an example magnetic field signal 410, a ppeak signal 420 representing a positive peak value of the magnetic field signal 410, a baseline level 440 representing an expected sensed signal at an infinite airgap condition and conventional threshold level 430 as may correspond to a percentage of a difference between the ppeak signal 420 and the baseline signal 440 for a magnetic field sensor implementing GMR as the magnetic field sensing element. The baseline corresponds to approximately the highest point of the signal during the valley. Here again, threshold level 430 may implement hysteresis by once the signal becomes larger than the hysteresis level (or the difference between the ppeak and npeak passes the hysteresis level), then the sensor leaves the start-up mode and enters normal operation.

The graph 450 shows the corresponding sensor output signal 460 for the GMR sensor implementing threshold level 430. As is shown, the sensor output signal 460 includes transitions 460c, 460d that coincide with target features, but additionally includes erroneous transitions 460a, 460b that do not coincide with target features. These erroneous transitions 460a, 460b are caused by the sensor starting up before a magnetic field signal valley and the threshold level 430 being smaller than the undershoot on the valley. These erroneous or false output signal transitions 460a, 460b can cause errors in determining the position of the target.

In accordance with the present disclosure, the threshold generator 24 (FIG. 1) is configured to generate a threshold level for use by the detector 20 that has a rising threshold level limit and a falling threshold level limit in order to prevent switching on the undershoot of the GMR-generated magnetic field signal upon start-up. The "rising" threshold level limit refers to the threshold level limit applied to a rising edge of the magnetic field signal and a "falling" threshold level limit refers to the threshold level limit applied to a falling edge of the magnetic field signal.

In embodiments, on the falling edge of the magnetic field signal, the threshold level can be the maximum of:
  (a) ppeak−[56.5%×(ppeak−baseline)];
  (b) baseline+100 codes; or
  (c) ppeak−100 codes
where the falling threshold level limit is given by baseline+100 codes. And, on the rising edge of the magnetic field signal, the threshold level can be the maximum of:
  (a) npeak+[56.5%×(ppeak−baseline)];
  (b) baseline+100 codes; or
  (c) npeak+100 codes
where the rising threshold level limit is given by baseline+100 codes.

It will be appreciated that 56.5% is only an example percentage, and any predetermined percentage can be implemented. Note that the value of "100 codes" is an example that may vary from case to case, depending upon the particular application for the magnetic field sensor. In general, the value of the limit is (i.e., "baseline+100 codes") is selected to ensure that the sensor output signal switches under maximum airgap conditions, but does not switch on the undershoot at the magnetic field signal valleys. The falling threshold level limit may be the same as the rising level limit (as is the case in the above example, when each limit is given by baseline+100 codes), or may be a different value, depending upon a particular application and the ppeak, npeak, and/or the baseline values. In general, the number of codes of the ADC can be selected based on an expected maximum value of the airgap and an expected undershoot of the magnetic field signal By applying the rising and falling threshold level limits, the detector 20 switches properly, even under maximum airgap conditions and it does not switch on the undershoots of the magnetic field signal.

Figure 5:
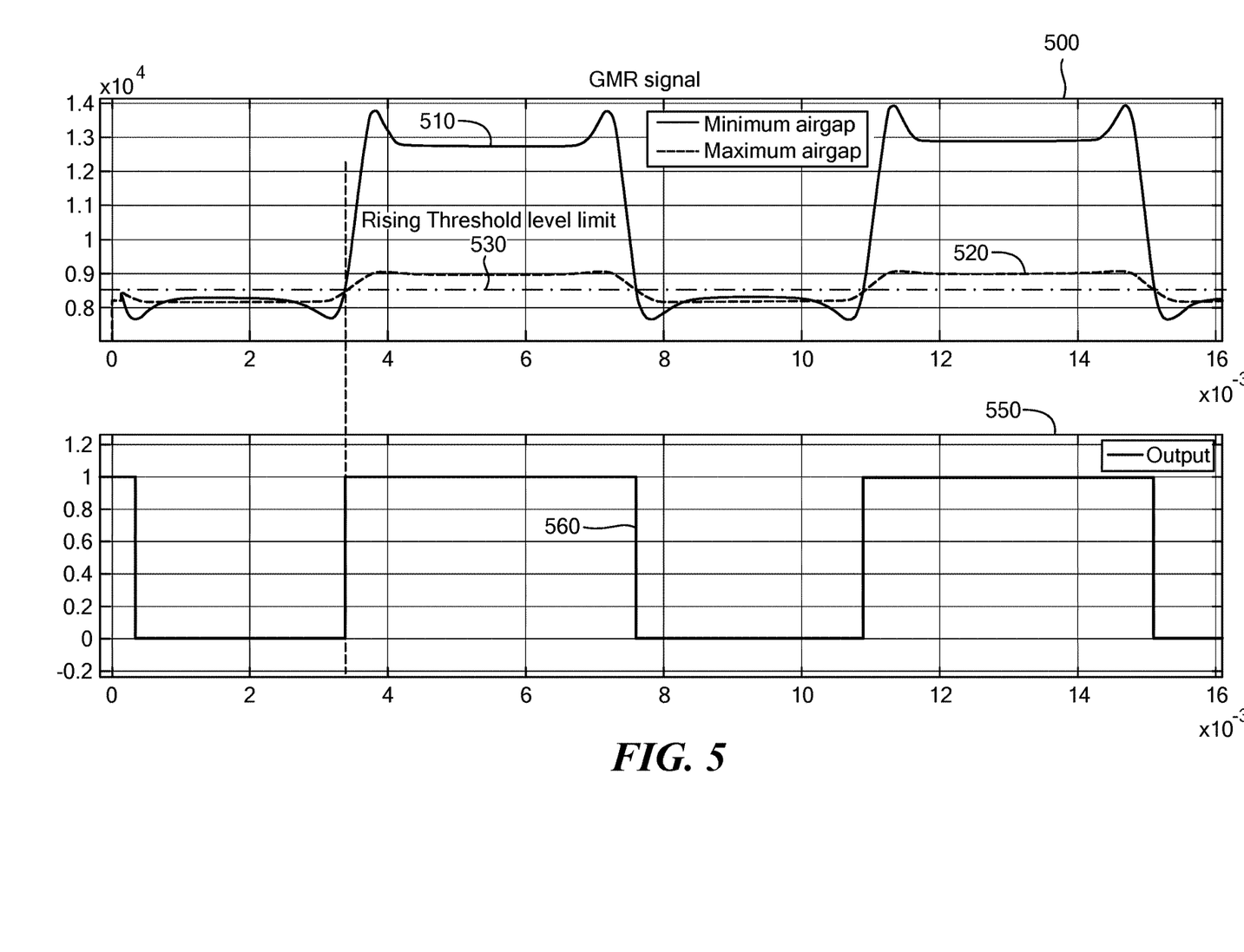
FIG. 5 shows example magnetic field signals and an example corresponding output signal for a magnetic field sensor having a GMR as the magnetic field sensing element and implementing a threshold level having a rising threshold level limit and a falling threshold limit according to the present disclosure.

FIG. 5 shows example magnetic field signals 510, 520 in graph 500 and an example corresponding sensor output signal 560 in graph 550 for magnetic field sensor 10 (FIG. 1) having one or more GMR element(s) 12 as the magnetic field sensing element(s) and implementing a threshold level having a rising threshold level limit and a falling threshold limit according to the present disclosure. The example magnetic field signal 510 corresponds to a minimum airgap between the sensor 10 at the target 18 and an example magnetic field signal 520 corresponds to a maximum airgap between the sensor and the target.

The threshold level limit 530 shown in graph 500 corresponds to both the rising threshold level limit and the falling threshold limit since such limits are the same (i.e., baseline+100 codes) in this example. The output signal 560 switches when the magnetic field signal 510, 4520 crosses the illustrated threshold level limit 530 because in the illustrated start-up mode of operation, the threshold level limit is the maximum of the possible threshold levels (i.e., baseline+100 codes is greater than threshold levels (a) and (c) in the above example threshold scheme).

By providing the threshold level limits as explained above, an accurate output signal 560 in graph 550 will be produced that does not have transitions at the GMR undershoot for both maximum airgap and minimum airgap conditions, thereby providing accurate position information of the target. Note that for minimum airgap conditions, it may be possible to simply increase the conventional threshold level (e.g., threshold level 430 of FIG. 4) so that it is not within the area of the undershoot, however such conventional threshold level would miss the maximum airgap signal 520. The rising and falling threshold level limits of the present disclosure allow for accurate position determination under a range of airgap conditions.

Figure 6:
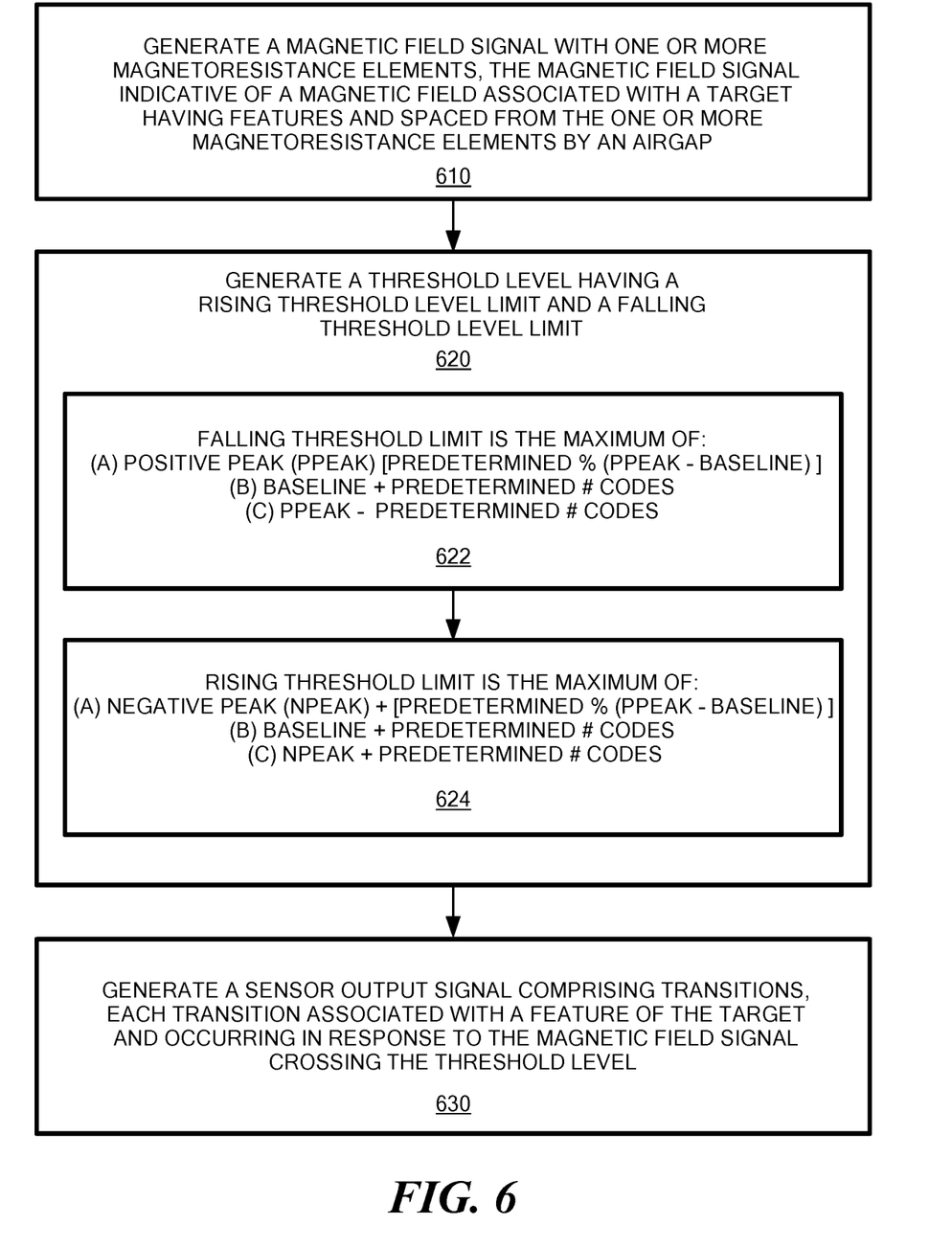
FIG. 6 is a flow diagram illustrating a process for generating the sensor output signal with the rising threshold level limit and the falling threshold level limit according to the present disclosure.

FIG. 6 is a flow diagram illustrating a process for generating the sensor output signal with the rising threshold level limit and the falling threshold level limit according to the disclosure. At block 610, the method commences by generating a magnetic field signal with one or more magnetoresistance elements, the magnetic field signal indicative of a magnetic field associated with a target having features and spaced from the one or more magnetoresistance elements by an airgap.

The method continues to block 620 to generate a threshold level having a rising threshold level limit and a falling threshold level limit. In particular, as indicated at block 622, the falling threshold limit is the maximum of (a) ppeak−[56.5%×(ppeak−baseline)]; (b) baseline+100 codes; or (c) ppeak−100 codes. And as indicated at at block 624, the rising threshold level limit can be the maximum of (a) npeak+[56.5%×(ppeak−baseline)]; (b) baseline+100 codes; or (c) npeak+100 codes.

At block 630, a sensor output signal is generated which comprises a plurality of transitions. Each transition is associated with a feature of the target and occurring in response to the magnetic field signal crossing the threshold level.

All references cited herein are hereby incorporated herein by reference in their entirety.

Having described various embodiments, it will now become apparent to one of ordinary skill in the art that other embodiments incorporating their concepts may be used. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims. Therefore, these embodiments should not be limited to disclosed embodiments, but rather should be limited only by the spirit and scope of the appended claims.

What is claimed is:

1. A magnetic field sensor comprising:
    at least one magnetoresistance element configured to generate a magnetic field signal indicative of a magnetic field associated with a target having features and spaced from the at least one magnetoresistance element by an airgap;
    a detector responsive to the magnetic field signal and to a threshold level to generate a sensor output signal containing transitions, each transition associated with a feature of the target and occurring in response to the magnetic field signal crossing the threshold level;
    a threshold generator configured to generate the threshold level having a rising threshold level limit and a falling threshold level limit; and
    an analog-to-digital converter configured to convert the magnetic field signal into a digitized magnetic field signal, wherein the analog-to-digital converter generates the digitized magnetic field signal represented by a predetermined number of codes, with each code corresponding to a value of the magnetic field signal.

2. The magnetic field sensor of claim 1, wherein the code is selected based on an expected maximum value of the airgap and an expected undershoot of the magnetic field signal.

3. The magnetic field sensor of claim 1, wherein the detector is configured to track a positive peak of the magnetic field signal to generate a positive peak value, track a negative peak of the magnetic field signal to generate a negative peak value, and track a baseline of the magnetic field signal corresponding to an infinite airgap between the at least one magnetoresistance element and the target.

4. The magnetic field sensor of claim 3, wherein the threshold level is a start-up threshold level used by the detector to generate the sensor output signal during a start-up mode of operation of the sensor and wherein the threshold generator is further configured to generate a running mode threshold level having a value that is a predetermined percentage of a difference between the positive peak value and the negative peak value.

5. The magnetic field sensor of claim 3, wherein the falling threshold level limit comprises the maximum of (a) the positive peak value minus a predetermined percentage of a difference between the positive peak value and a baseline value; (b) the baseline value plus the predetermined number of codes; or (c) the positive peak value minus the predetermined number of codes.

6. The magnetic field sensor of claim 3, wherein the rising threshold level limit comprises the maximum of (a) the negative peak value plus a predetermined percentage of a difference between the positive peak value and a baseline value; (b) the baseline value plus the predetermined number of codes; or (c) the negative peak value plus the predetermined number of codes.

7. The magnetic field sensor of claim 1, wherein the at least one magnetoresistance element comprises one or more GMR and/or TMR elements.

8. The magnetic field sensor of claim 7, wherein the magnetic field sensor comprises a camshaft speed sensor.

9. A method comprising:
    generating a magnetic field signal with at least one magnetoresistance element, the magnetic field signal indicative of a magnetic field associated with a target having features and spaced from the at least one magnetoresistance element by an airgap;
    generating a threshold level having a rising threshold level limit and a falling threshold level limit;
    generating a sensor output signal comprising transitions, each transition associated with a feature of the target and occurring in response to the magnetic field signal crossing the threshold level; and
    converting the magnetic field signal into a digitized magnetic field signal by an analog-to-digital converter, wherein the analog-to-digital converter generates the digitized magnetic field signal represented by a predetermined number of codes, with each code corresponding to a value of the magnetic field signal.

10. The method of claim 9, wherein a detector is responsive to the threshold level and to the magnetic field signal, and further comprising, by the detector, tracking a positive peak of the magnetic field signal to generate a positive peak value, tracking a negative peak of the magnetic field signal to generate a negative peak value, and tracking a baseline of the magnetic field signal corresponding to an infinite airgap between the at least one magnetoresistance element and the target.

11. The method of claim 10, wherein the threshold level is a start-up threshold level used by the detector to generate the sensor output signal during a start-up mode of operation and wherein the method further comprises generating a running mode threshold level having a value that is a predetermined percentage of a difference between the positive peak value and the negative peak value.

12. The method of claim 10, wherein the falling threshold level limit comprises the maximum of (a) the positive peak value minus a predetermined percentage of a difference between the positive peak value and a baseline value; (b) the baseline value plus the predetermined number of codes; or (c) the positive peak value minus the predetermined number of codes.

13. The method of claim 10, wherein the rising threshold level limit comprises the maximum of (a) the negative peak value plus a predetermined percentage of a difference between the positive peak value and a baseline value; (b) the baseline value plus the predetermined number of codes; or (c) the negative peak value plus the predetermined number of codes.

14. A magnetic field sensor comprising:
    means for generating a magnetic field signal with at least one magnetoresistance element, the magnetic field signal indicative of a magnetic field associated with a target having features and spaced from the at least one magnetoresistance element by an airgap;

means for generating a threshold level having a rising threshold level limit and a falling threshold level limit;

means for generating a sensor output signal comprising transitions, each transition associated with a feature of the target and occurring in response to the magnetic field signal crossing the threshold level; and means for converting the magnetic field signal into a digitized magnetic field signal represented by a predetermined number of codes, each code corresponding to a value of the magnetic field signal.

15. The magnetic field sensor of claim 14, further comprising means for tracking a positive peak of the magnetic field signal to generate a positive peak value, tracking a negative peak of the magnetic field signal to generate a negative peak value, and tracking a baseline of the magnetic field signal corresponding to an infinite airgap between the at least one magnetoresistance element and the target.

16. The magnetic field sensor of claim 15, wherein the threshold level is a start-up threshold level used to generate the sensor output signal during a start-up mode of operation of the sensor and wherein the magnetic field sensor further comprises means for generating a running mode threshold level having a value that is a predetermined percentage of a difference between the positive peak value and the negative peak value.

* * * * *

UNITED STATES PATENT AND TRADEMARK OFFICE
CERTIFICATE OF CORRECTION

PATENT NO. : 10,845,214 B2
APPLICATION NO. : 16/397162
DATED : November 24, 2020
INVENTOR(S) : Florian Kulla et al.

Page 1 of 1

It is certified that error appears in the above-identified patent and that said Letters Patent is hereby corrected as shown below:

On the Title Page

Item (73) Assignee: delete "Allego" and replace with --Allegro--.

In the Specification

Column 6, Line 4 delete "value above" and replace with --value being above--.

Column 6, Line 28 delete "pole pair." and replace with --pole pairs.--.

Column 6, Line 30 delete "embedment" and replace with --embodiment--.

Column 6, Line 41 delete "airgap" and replace with --airgaps--.

Column 10, Lines 21-22 delete "threshold limit" and replace with --threshold level limit--.

Column 10, Line 29 delete "threshold limit" and replace with --threshold level limit--.

Column 10, Line 31 delete "signal 510, 4520" and replace with --signals 510, 520--.

Column 10, Line 62 delete "threshold limit" and replace with --threshold level limit--.

Column 10, Line 64 delete "at at" and replace with --at--.

Signed and Sealed this
Nineteenth Day of April, 2022

Katherine Kelly Vidal
*Director of the United States Patent and Trademark Office*